(12) United States Patent
Ngo et al.

(10) Patent No.: US 10,880,991 B2
(45) Date of Patent: Dec. 29, 2020

(54) APPARATUS AND METHODS FOR ENHANCING SIGNALING BANDWIDTH IN AN INTEGRATED CIRCUIT PACKAGE

(71) Applicant: Marvell World Trade Ltd., St. Michael (BB)

(72) Inventors: Thomas T. Ngo, San Jose, CA (US); Xinlei Ding, Shanghai (CN); Dance Wu, Palo Alto, CA (US); Chengchih Shih, Fremont, CA (US); Zhiqiang Li, Shanghai (CN)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/177,176

(22) Filed: Oct. 31, 2018

(65) Prior Publication Data

US 2019/0313523 A1 Oct. 10, 2019

Related U.S. Application Data

(60) Provisional application No. 62/652,736, filed on Apr. 4, 2018.

(51) Int. Cl.
*H05K 1/02* (2006.01)
*H01L 23/00* (2006.01)
*H01L 23/66* (2006.01)
*H01L 23/49* (2006.01)

(52) U.S. Cl.
CPC .......... *H05K 1/0245* (2013.01); *H01L 23/49* (2013.01); *H01L 23/66* (2013.01); *H01L 24/46* (2013.01); *H05K 1/0236* (2013.01); *H05K 1/0243* (2013.01); *H01L 2223/6611* (2013.01); *H01L 2224/4823* (2013.01); *H01L 2924/14* (2013.01);

(Continued)

(58) Field of Classification Search
None
See application file for complete search history.

(56) References Cited

U.S. PATENT DOCUMENTS 8,288,203 B2 * 10/2012 Cho .................... H01L 24/19
438/107
8,384,231 B2 * 2/2013 Grivna ................ H01L 25/0655
257/787

(Continued)

FOREIGN PATENT DOCUMENTS

WO  WO-2019172922 A1 * 9/2019 ............... H05K 7/10

*Primary Examiner* — Long Pham (57) ABSTRACT

Embodiments described herein provide an electronic device having an integrated circuit disposed in a surface mount package. The surface mount integrated circuit package comprises a first pin and a second pin of the integrated circuit configured to couple the integrated circuit to a first terminal and a second terminal disposed on a circuit board. The first pin and second pin define a first connector and a second connector of a differential connector pair in the surface mount integrated circuit package for transferring differential signals from the integrated circuit to the circuit board. The surface mount integrated circuit package comprises an isolation stud disposed between the first pin and the second pin. The isolation stud is disconnected from the integrated circuit and configured to enlarge a gap between the first pin and the second pin relative to respective gaps of other pins coupling the electronic device to the circuit board.

8 Claims, 5 Drawing Sheets

(52) U.S. Cl.
CPC .............. *H01L 2924/3011* (2013.01); *H05K 2201/10689* (2013.01)

(56) References Cited

U.S. PATENT DOCUMENTS

| | | | |
|---|---|---|---|
| 8,416,498 B2* | 4/2013 | Sakaki | B29C 33/3878 359/619 |
| 9,761,619 B2* | 9/2017 | Kim | H01L 27/1469 |
| 2013/0249079 A1* | 9/2013 | Lee | H01L 29/0657 257/737 |
| 2015/0330915 A1* | 11/2015 | Jin | G01N 23/225 378/62 |
| 2016/0343800 A1* | 11/2016 | Grivna | H01L 29/06 |
| 2018/0069049 A1* | 3/2018 | Boettiger | H01L 27/14687 |

* cited by examiner

502
Place a First Pin Configured to Couple the Integrated Circuit to a First Terminal Disposed on a Circuit Board, the First Pin Defining a First Connector of a Differential Connector Pair in a Surface Mount Integrated Circuit Package for Transferring Differential Signals from the Integrated Circuit to the Circuit Board

504
Place a Second Pin Coupling the Integrated Circuit to a Second Terminal Disposed on the Circuit Board, the Second Pin Defining a Second Connector of the Differential Connector Pair in the Surface Mount Integrated Circuit Package, Wherein the Second Pin is Disposed Adjacent to the First Pin

506
Place an Isolation Stud Disposed Between Respective Distal Ends of the First Pin and the Second Pin, Relative to the Integrated Circuit, the Isolation Stub Being Disconnected from the Integrated Circuit and Configured to Enlarge a Gap Between the First Pin and the Second Pin Relative to Respective Gaps of Other Pins Coupling the Electronic Device to the Circuit Board

FIG. 5

APPARATUS AND METHODS FOR ENHANCING SIGNALING BANDWIDTH IN AN INTEGRATED CIRCUIT PACKAGE

CROSS-REFERENCE TO RELATED APPLICATION

This claims the benefit under 35 U.S.C. § 119(e) of U.S. Provisional Patent Application No. 62/652,736, filed Apr. 4, 2018, which is hereby incorporated by reference herein in its entirety.

FIELD OF USE

This disclosure relates generally to enhancing the performance of an integrated circuit package. More specifically, this invention relates to enhancing differential signaling bandwidth in an electrical link.

BACKGROUND OF THE INVENTION

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

A quad flat package (QFP) is a low-cost surface mount technology (SMT) integrated circuit package. The QFP usually takes the form of a square or rectangular shaped circuit chip package having mounting pin leads extending from all four sides of the circuit chip. The mounting pin leads are used to mount the QFP on the surface of a circuit board, and each pin acts as a connector that connects at least a circuit component within the QFP to the circuit board. Typically, the QFP is used as a package that couples an integrated circuit to a circuit board. Differential signaling is often used to increase signal integrity among mounting pin leads. A pair of pins, sometimes adjacent pins on one side of the QFP, are each configured to transmit a differential signal. The differential pairs can sometimes experience a high impedance due to the physical layout of package pin leads and wire bonds. The high impedance of the differential pairs in turn has been found in various applications to limit the bandwidth for signal transmission between an integrated circuit packaged by the QFP and other components on the circuit board, thereby restricting the utility and performance of the QFP in some high-speed communication system application, for example.

SUMMARY

Embodiments described herein provide an electronic device having an integrated circuit disposed in a surface mount package. The integrated circuit package comprises a first pin configured to couple the integrated circuit to a first terminal disposed on a circuit board. The first pin defines a first connector of a differential connector pair in the surface mount integrated circuit package for transferring differential signals from the integrated circuit to the circuit board.

The surface mount integrated circuit package comprises a second pin of configured to couple the integrated circuit to a second terminal disposed on the circuit board. The second pin defines a second connector of the differential connector pair in the surface mount integrated circuit package, and the second pin is disposed adjacent to the first pin.

The surface mount integrated circuit package comprises an isolation stud disposed between respective distal ends of the first pin and the second pin, relative to the integrated circuit. The isolation stud is disconnected from the integrated circuit and configured to enlarge a gap between the first pin and the second pin relative to respective gaps of other pins coupling the electronic device to the circuit board.

In some embodiments, the surface mount integrated circuit package is a low profile Quad Flat Package.

In some embodiments, the isolation stud is part of or coupled to a third terminal of the circuit board between the first terminal and the second terminal.

In some embodiments, the integrated circuit includes a first ground pin adjacent to the first pin configured to couple the integrated circuit to a ground terminal disposed on the circuit board, and a second ground pin adjacent to the second pin configured to couple the integrated circuit to the ground terminal disposed on the circuitry board.

In some embodiments, the differential connector pair is configured to transmit a pair of differential signals from the integrated circuit to the circuit board. In some embodiments, the differential connector pair is configured to transfer a pair of differential signals received at the circuit board to the integrated circuit.

In some embodiments, the isolation stud is disposed between the respective distal ends of the first pin and the second pin to enlarge the gap between the respective distal ends of the first pin and the second pin to reduce a level of interference caused by the first connector on the second connector and to reduce a level of interference caused by the second connector on the first connector.

In some embodiments, the first connector and the second connector that are separated by an isolation stud transfer differential signals at an increased bandwidth relative to pairs of connectors not separated by a corresponding isolation stud.

Embodiments described herein provide a method for manufacturing an electronic device having an integrated circuit packaged in a surface mount circuit package. The method comprises placing a first pin configured to couple the integrated circuit to a first terminal disposed on a circuit board. The first pin defines a first connector of a differential connector pair in the surface mount integrated circuit package for transferring differential signals from the integrated circuit to the circuit board.

The method comprises placing a second pin coupling the integrated circuit to a second terminal disposed on the circuit board. The second pin defines a second connector of the differential connector pair in the surface mount integrated circuit package, wherein the second pin is disposed adjacent to the first pin.

The method comprises placing an isolation stud disposed between respective distal ends of the first pin and the second pin, relative to the integrated circuit. The isolation stud is disconnected from the integrated circuit and configured to enlarge a gap between the first pin and the second pin relative to respective gaps of other pins coupling the electronic device to the circuit board.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for enhancing differential signaling bandwidth in electrical links of a low-cost integrated circuit package, including various lead frame package variants such as quad flat packages (QFP) packages for example. Specifically, in view of the problem that differential pairs in a QFP package often face a high impedance that limits the bandwidth of signaling, embodiments described herein provide a high-speed differential pair design for a QFP package that utilizes a redundant stud interposed between differential pairs of pins to reduce impedance in a low-cost QFP package. Although reference is made specifically to QFP type packaging in this description, QFP is described merely an example. Techniques and structures described herein are adaptable for other related packaging technologies as well, and the term QFP is to be construed as also referring to other such suitable packaging technologies.

The redundant stud insertion layout increases the distance between the pin leads of a differential pair, and thus reduces signal reflection caused by the high inductance among closely spaced parallel pins and bond wires. The inductance and impedance reduction in the differential pairs in turn enhances the bandwidth that differential pairs are able to provide in an electrical channel link.

Figure 1:
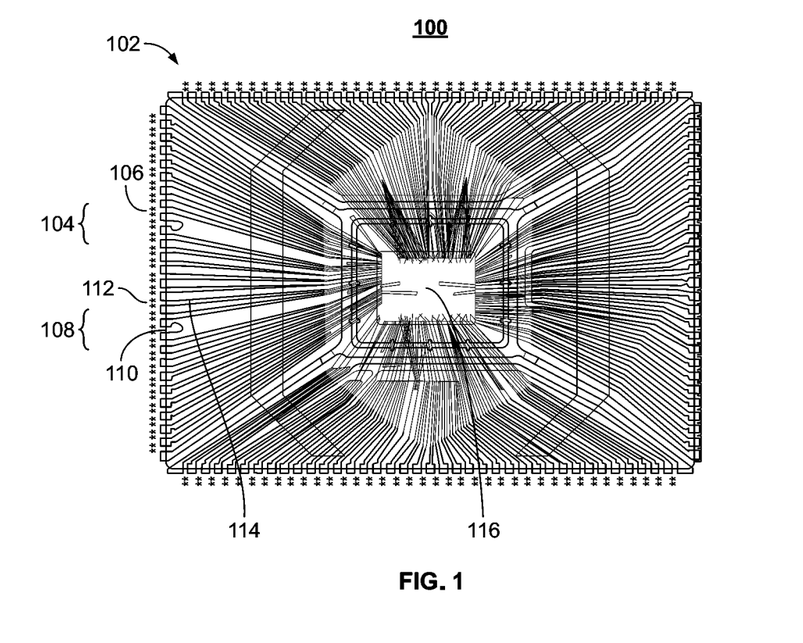
FIG. 1 is a top view of a quad flat packet arrangement, according to some embodiments described herein.

FIG. 1 is a top view of a quad flat package (QFP) arrangement, according to some embodiments described herein. QFP arrangement 102 is a high-level view of the layout of an example QFP having 128 pin leads, a semiconductor die 116, and bond wires corresponding to the 128 pin leads. Pin lead 112 is an example pin of the QFP arrangement 102. The bond wire 114 connects pin lead 112 to the semiconductor die 116. The pin lead 112 and bond wire 114 typically are hermetically sealed in a compound (e.g., epoxy resin, etc.) to protect the semiconductor die 116.

The QFP arrangement 102 is configured to use dedicated pin leads to transmit high-speed signals in a differential mode, in order to support high-bandwidth communication between the QFP 102 and other components on the circuit board on to which the QFP 102 is mounted. Two examples of differential pairs of pin leads, 104 and 108, are shown at QFP 102. In various implementations a greater or lesser number of differential pairs is provided. In some embodiments, differential pair 104 is configured as a receiving differential pair that is configured to receive a signal in differential form and differential pair 108 is configured as a transmitting differential pair that is configured to transmit a signal in differential form. For example, in differential signaling, the same electrical signal is received or transmitted in the form of a differential pair of two complementary signals, each through a respective pin lead of a differential pair of pins. One combination of a pin lead (from the differential pair) and associated bond wires is configured to carry the original electrical signal under the original supply voltage of the system (e.g., +0.5 v, etc.), and the other combination of pin lead (from the differential pair) and bond wire is configured to carry the differential electrical signal under the opposite voltage of the original supply voltage of the system (e.g., −0.5 v). When a pair of differential signals are received, the two signals are subtracted from each other to recover the original signal. For example, at the receiving terminal, the differential electrical signal under the opposite voltage of the original supply voltage of the system (e.g., −0.5 v) is subtracted from the signal under the original supply voltage of the system (+0.5 V) to get a resulting signal of 1.0 V (0.5 V−(−0.5 V)=1.0 V). When a signal is transmitted using differential signaling, the signal transmission yields improved noise immunity and lower interference to other signals compared with the scenario when the signal is transmitted alone as a single-ended signal.

The use of a differential pair of pin leads, such as 104 and 108, however, can often lead to high impedance of the circuit, which limits the bandwidth of signal transmission. In and embodiment, isolation studs 106 and 110 are inserted between the two pins of each differential pair 104 and 108. The inserted stud increases the distance between the respective pin leads and bond wires forming differential pairs and increases the effective signaling bandwidth of so configured differential pairs in the QFP arrangement 102, in comparison to conventional differential pairs in which the respective pin leads and bond wires are adjacent to each other. The isolation studs 106 and 110 are detached from any pin lead or bond wire and thus are also detached from the circuit inside the QFP arrangement 102. The isolation stud 106 or 108 is physically disposed at the gap space between the two pin leads of the differential pair, and each has a length that terminates near the outside edge.

Figure 2:
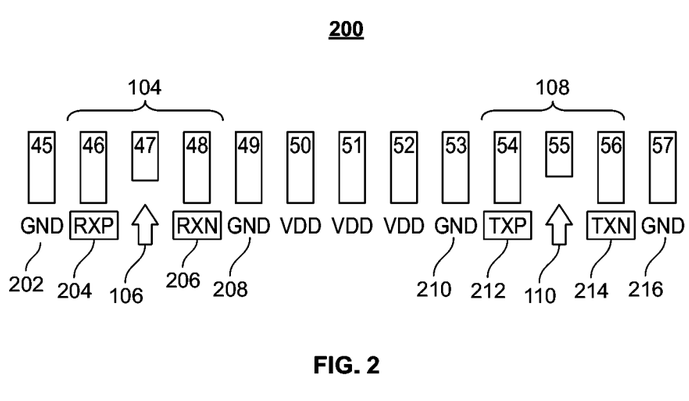
FIG. 2 depicts unconventional pin assignment of the dedicated pins for the transmission and receiving differential pairs of the QFP arrangement described in FIG. 1, according to some embodiments described herein.

FIG. 2 is a block diagram that depicts pin lead assignments of the dedicated pin leads for example transmission and receiving differential pairs of the QFP arrangement described in FIG. 1, according to some embodiments described herein. FIG. 2 is a detailed depiction of pin leads corresponding to the two differential pairs 104 and 108 of QFP arrangement 102 of FIG. 1. For illustrative purpose only, differential pair 104 depicted in FIG. 2 is configured as a receiving (RX) differential pair. The receiving differential pair 104 includes a positive receiving pin lead 204 and a negative receiving pin lead 206. In between the positive receiving pin lead 204 and the negative receiving pin lead 206, an isolation stud 106 is disposed, which is detached from either of the pin lead 204 and 206, or any bond wire, or any part of the semiconductor die 116. The positive pin lead 204 has a ground pin 202 adjacent to it. Similarly, the negative receiving pin lead 206 has a ground pin 208 adjacent to it. The ground pins 202 and 208 isolate the differential pair pin leads 204 and 206 from other pin leads disposed on the QFP arrangement 102. In some embodiments, ground pins 202 and 208 increase the distance of the differential pair 104 from other pin leads of the QFP arrangement 102, which reduces loop inductance and crosstalk caused by other neighboring pin leads of the QFP arrangement 102 on the differential pair pin leads 204 and 206. In this way, the reduced impact from loop inductance and crosstalk can improve the integrity of signals transmitted through differential pair pin leads 204 and 206.

For illustrative purposes only, differential pair 108 depicted in FIG. 2 is configured as a transmitting (TX) differential pair. The transmitting differential pair 108 includes a positive transmitting pin lead 212 and a negative transmitting pin lead 214. In between the positive transmitting pin lead 212 and the negative transmitting pin lead 214, an isolation stud 110 is disposed, which is detached from either of the pin lead 212 and 214, or any bond wire, or any part of the semiconductor die 116. The positive transmitting pin lead 212 has a ground pin lead 210 adjacent to it. Similarly, the negative transmitting pin lead 214 has a ground pin lead 216 adjacent to it. The ground pin leads 210 and 216 isolate the transmitting differential pair pin leads 212 and 214 from other pin leads disposed on the QFP arrangement 102. In some embodiments, disposing ground pins adjacent to the differential pair pin leads 212 and 214 reduces the loop inductance and cuts crosstalk from other pins in the QFP arrangement 102 on the differential pair pin leads 212 and 214.

Figure 3:
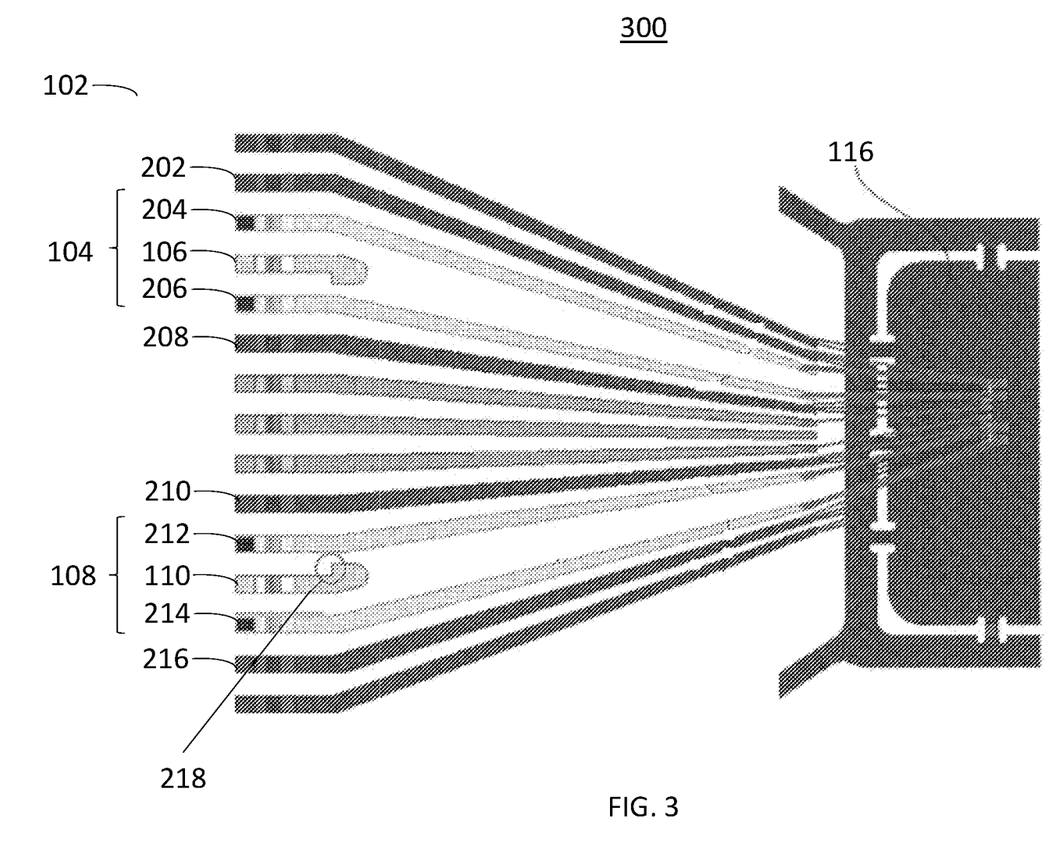
FIG. 3 is an enlarged view of a segment of a QFP package illustrating the dedicated high-speed differential pairs described above in FIG. 1, according to some embodiments described herein.

FIG. 3 is an enlarged view of a segment of a QFP package illustrating the dedicated high-speed differential pairs described above in FIG. 1, according to some embodiments described herein. FIG. 3 builds on the block diagram of FIG. 2 by further depicting bond wires that connect each pin lead described in FIG. 2 to the semiconductor die 116 of QFP 112. As depicted in FIG. 3, receiving differential pair 104 has a positive pin lead 204 and a negative pin lead 206 with an isolation stud 106 inserted between them.

Both positive pin lead 204 and negative pin lead 206 have a corresponding bond wire that connects the pin lead to semiconductor die 116. The pin leads 204 and 206 are also used to connect the QFP arrangement 102 to a larger circuit, such as a printed circuit board. However, isolation stud 106 does not have a bond wire connecting the isolation stud 106 to the semiconductor die 116. Isolation stud 106 is also not connected to any part of QFP arrangement 102. As depicted in FIG. 3, isolation stud 106, as disposed between the receiving differential pair 104, increases the distance between the positive pin 204 and the positive pin 206 and their corresponding bond wires, as compared to distances between other pins ground pin lead 202 and positive pin lead 204, for example.

The increase in distance caused by the insertion of the isolated stud between the differential pair of pin leads, i.e., the positive pin lead 204 and the negative pin lead 206, decreases capacitance coupling between the positive pin lead 204 on the negative pin lead 206, which are intrapair wires of the differential pair. In some embodiments, the increase in distance caused by the insertion of the isolated stud between the intrapairs and ground pins placed next to the intrapairs maintain the system impedance control.

As noted, the increase in distance between the positive pin lead 204 and the negative pin lead 206 decreases capacitance coupling between differential pair of pin leads, i.e., the positive pin lead 204 and the negative pin lead 206, and their corresponding bond wires. For example, the capacitance between two charged plates is inversely related to distance between the two plates. Therefore, increase in distance between the positive pin lead 204 and the negative pin lead 206 of the differential pair 104 and their corresponding bond wires decreases a capacitance coupling between the pin leads of differential pair 104. The decreased capacitance in turn reduces the relative impedance created by the positive pin lead 204 on negative pin lead 206, and also reduces the relative impedance created by the negative pin lead 206 on the positive pin lead 204. As a result of the reduced relative impedance, bandwidth of electrical signal transmission is improved for differential pair 104.

Ground pins 202 and 208 are configured to isolate the receiving differential pair from other pins and bond wires of QFP arrangement 102. The isolation from other pins and bond wires reduces interference such as noise or crosstalk from other pins and bond wires to the differential pair 104. The reduction in such interference allows the differential pair 104 to transmit more error free data with the same power. Therefore, the isolation of the differential pair 104 using ground pins 202 and 208 also contributes towards increasing the bandwidth of the receiving differential pair 104.

Transmitting differential pair 108 has a similar design to receiving differential pair 104. An isolation stud 110 is inserted between the positive transmitting pin lead 212 and negative transmitting pin lead 214. Ground pin leads 210 and 216 isolate the differential pair from other pins and bond wires of QFP arrangement 102. The increased gap between the intrapair leads and wires of differential pair 108 created by the isolation stud 110 increases the bandwidth of the transmitting differential pair 108, in an embodiment, for the same reasons as elaborated above with respect to the receiving differential pair.

In some embodiments, isolation studs 106 and 110 include an anchor hook 218. In some embodiments, the anchor hook 218 is used to hold the isolation stud at a fixed place within the QFP lead frame. This is because, the isolation stud is not connected to any bond wire unlike the other pins of the QFP arrangement 102. In case of other pins leads (e.g., 202, 204, 206, 208, 210, 212, 214, and 216) the relevant anchor hooks are detached.

In some embodiments, the removal of the anchor hook from pin leads of the QFP arrangement 102 improves impedance control on the pin leads of QFP arrangement 102. For example, removing anchor hook from the positive pin lead 204 and negative pin lead 206 of differential pair 104 reduces the area of the respective pin leads. Reducing the area of the positive pin lead 204 and negative pin lead 206 of differential pair 104 decreases the capacitance coupling between the positive pin lead 204 and negative pin lead 206 of differential pair 104. Additionally, removing the anchor hooks reduces impedance discontinuities that are caused step-like changes in the width of spacing between intrapair wires of a differential pair, in an embodiment.

Figure 4:
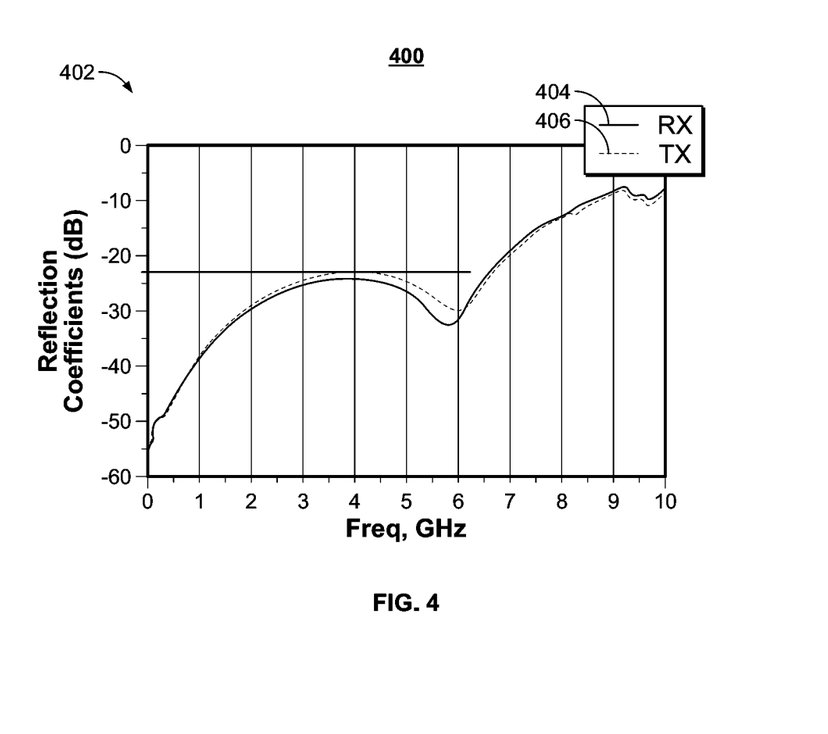
FIG. 4 is a plot of a reflection coefficient of a three-dimensional field simulation result of the differential pair described in FIG. 1, according to some embodiments described herein.

FIG. 4 is a plot of a reflection coefficient of a three-dimensional field simulation result of the differential pair described in FIG. 1, according to some embodiments described herein. Plot 402 of FIG. 4 is a graph between reflection coefficients (in dB) of a differential pair (104 or 108) against frequencies (in GHz) of transmission. The dotted line 406 illustrates a data plot showing the transmission differential pair 108 in QFP arrangement 102, and the solid line 404 illustrates a data plot corresponding to the receiving differential pair 104 of QFP arrangement 102. The return loss of both transmission differential pair 108 and receiving differential pair 104 is below −23 dB at GHz Nyquist frequency.

Figure 5:
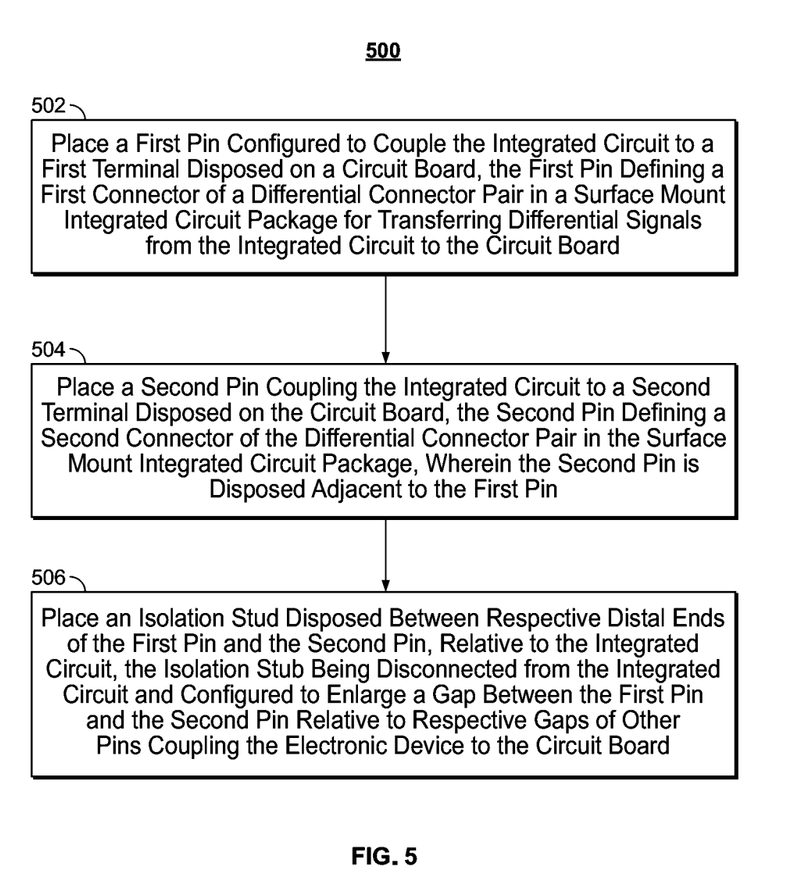
FIG. 5 shows a high-level flow chart for a process for manufacturing a quad flat packet arrangement as described in FIG. 1, in accordance with an embodiment of the present disclosure.

FIG. 5 shows an example flow chart for a process for manufacturing a QFP arrangement (e.g., QFP arrangement 102 shown in FIG. 1), in accordance with an embodiment of the present disclosure.

At 502, a first pin (e.g., see 204 in FIG. 2) of the integrated circuit (e.g., see 102 in FIG. 1) configured to couple the integrated circuit to a first terminal disposed on a circuit board is placed on the circuit board. The first pin defines a first connector of a differential connector pair in a surface mount integrated circuit package for transferring differential signals from the integrated circuit to the circuit board. In some embodiments, in the case of receiving differential pair 104, the positive pin lead 204 may be the first pin disposed on the integrated circuit board that connects the semiconductor die 116 to a portion on the circuit board with the help of a bond wire as described in FIGS. 1-3. Similarly, in case of transmitting differential pair 108, the positive pin lead 212 may be the first pin disposed on the integrated circuit board that connects the semiconductor die 116 to a portion on the circuit board with the help of a bond wire as described in FIGS. 1-3.

At 504, a second pin of the integrated circuit configured to couple the integrated circuit to a second terminal disposed on the circuit board, the second pin defining a second connector of the differential connector pair in the surface mount integrated circuit package is placed on the circuit board, wherein the second pin is disposed adjacent to the first pin. In some embodiments, in the case of receiving differential pair 104, the negative pin lead 206 may be the second pin disposed on the integrated circuit board that connects the semiconductor die 116 to a portion on the circuit board with the help of a bond wire as described in FIGS. 1-3. Similarly, in case of transmitting differential pair 108, the negative pin lead 214 may be the second pin disposed on the integrated circuit board that connects the semiconductor die 116 to a portion on the circuit board with the help of a bond wire as described in FIGS. 1-3.

At 506, an isolation stud is provided between respective distal ends of the first pin and the second pin, relative to the integrated circuit, the isolation stud being disconnected from the integrated circuit and configured to enlarge a gap between the first pin and the second pin relative to respective gaps of other pins coupling the electronic device to the circuit board. In some embodiments, the isolation stud 106 disposed between the positive pin lead 204 and the negative pin lead 206 is not connected to the semiconductor die 116 or to any other art of QFP arrangement 102.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in flow diagrams in a particular order, this is not to be construed as requiring that such operations be performed in the particular order shown or in sequential order, or that all illustrated operations be performed to achieve the desirable results.

The subject matter of this specification has been described in terms of particular aspects, but other aspects can be implemented and are within the scope of the claims.

What is claimed is:

1. An electronic device having an integrated circuit disposed in a surface mount package, comprising:
   a first pin of the integrated circuit configured to couple the integrated circuit to a first terminal disposed on a circuit board, the first pin defining a first connector of a first differential connector pair in the surface mount integrated circuit package for transferring differential signals from the integrated circuit to the circuit board;
   a second pin of the integrated circuit configured to couple the integrated circuit to a second terminal disposed on the circuit board, the second pin defining a second connector of the first differential connector pair in the surface mount integrated circuit package, wherein the second pin is disposed adjacent to the first pin; and
   an isolation stud disposed between respective distal ends of the first pin and the second pin, relative to the integrated circuit, the isolation stud being disconnected from the integrated circuit and configured to enlarge a gap between the first pin and the second pin relative to respective gaps of other pins coupling the electronic device to the circuit board.

2. The device of claim 1, wherein the surface mount integrated circuit package is a low profile Quad Flat Package.

3. The device of claim 1, wherein the isolation stud is part of or coupled to a third terminal of the circuit board between the first terminal and the second terminal.

4. The device of claim 1, further comprising:
   a first ground pin adjacent to the first pin configured to couple the integrated circuit to a ground terminal disposed on the circuit board, and a second ground pin adjacent to the second pin configured to couple the integrated circuit to the ground terminal disposed on the circuit board.

5. The device of claim 1, wherein the first differential connector pair is configured to transmit a pair of differential signals from the integrated circuit to the circuit board.

6. The device of claim 1, wherein the first differential connector pair is configured to transfer a pair of differential signals received at the circuit board to the integrated circuit.

7. The device of claim 1, wherein the isolation stud is disposed between the respective distal ends of the first pin and the second pin to enlarge the gap between the respective distal ends of the first pin and the second pin to reduce a level of interference caused by the first connector on the second connector and to reduce a level of interference caused by the second connector on the first connector.

8. The device of claim 1, wherein the first connector and the second connector that are separated by an isolation stud transfer differential signals at an increased bandwidth relative to pairs of connectors not separated by a corresponding isolation stud.

* * * * *